United States Patent [19]

Wright et al.

[11] 4,399,485
[45] Aug. 16, 1983

[54] AIR BAFFLE ASSEMBLY FOR ELECTRONIC CIRCUIT MOUNTING FRAME

[75] Inventors: Kurt O. Wright, Sun Valley; Timothy L. Brehm, Irvine; Duaine E. Berger, Los Angeles; Paul S. Matsuoka, Culver City, all of Calif.

[73] Assignee: Ampex Corporation, Redwood City, Calif.

[21] Appl. No.: 332,480

[22] Filed: Dec. 21, 1981

Related U.S. Application Data

[63] Continuation of Ser. No. 133,277, Mar. 24, 1980, abandoned.

[51] Int. Cl.³ .............................................. H05K 7/20
[52] U.S. Cl. ................................... 361/383; 165/80 B; 361/384; 361/415; 174/16 R
[58] Field of Search ................................ 361/381–385, 361/415; 174/16 R; 165/159–161, 80 B, 80 D

[56] References Cited

U.S. PATENT DOCUMENTS 3,187,082  6/1965  Allison .............................. 165/80 B
3,236,296  2/1966  Dubin ............................... 165/80 B
3,967,874  7/1976  Calabro ............................. 361/384

FOREIGN PATENT DOCUMENTS 874796  8/1961  United Kingdom ................ 361/383

Primary Examiner—G. P. Tolin
Attorney, Agent, or Firm—Fraser and Bogucki

[57] ABSTRACT

A variable width baffle assembly maintains constant, uniform impedance to the flow of cooling air across a vacant space on a partially populated electronic mounting frame for printed circuit board assemblies. The inexpensive but reliable baffle assembly includes end boards mounted on opposite sides of the space and a web member extending therebetween. The web member has a plurality of small apertures distributed thereover with a ratio of aperture area to web member surface area selected to approximate the impedance presented by populated portions of the frame. The web member may be mounted in arched, hinged, corrugated or sliding relationship to accommodate changes in the spacing between end boards so that a single model of baffle assembly can accommodate multiple sizes of vacant spaces.

9 Claims, 8 Drawing Figures

U.S. Patent  Aug. 16, 1983  Sheet 1 of 2  4,399,485
FIG. 1
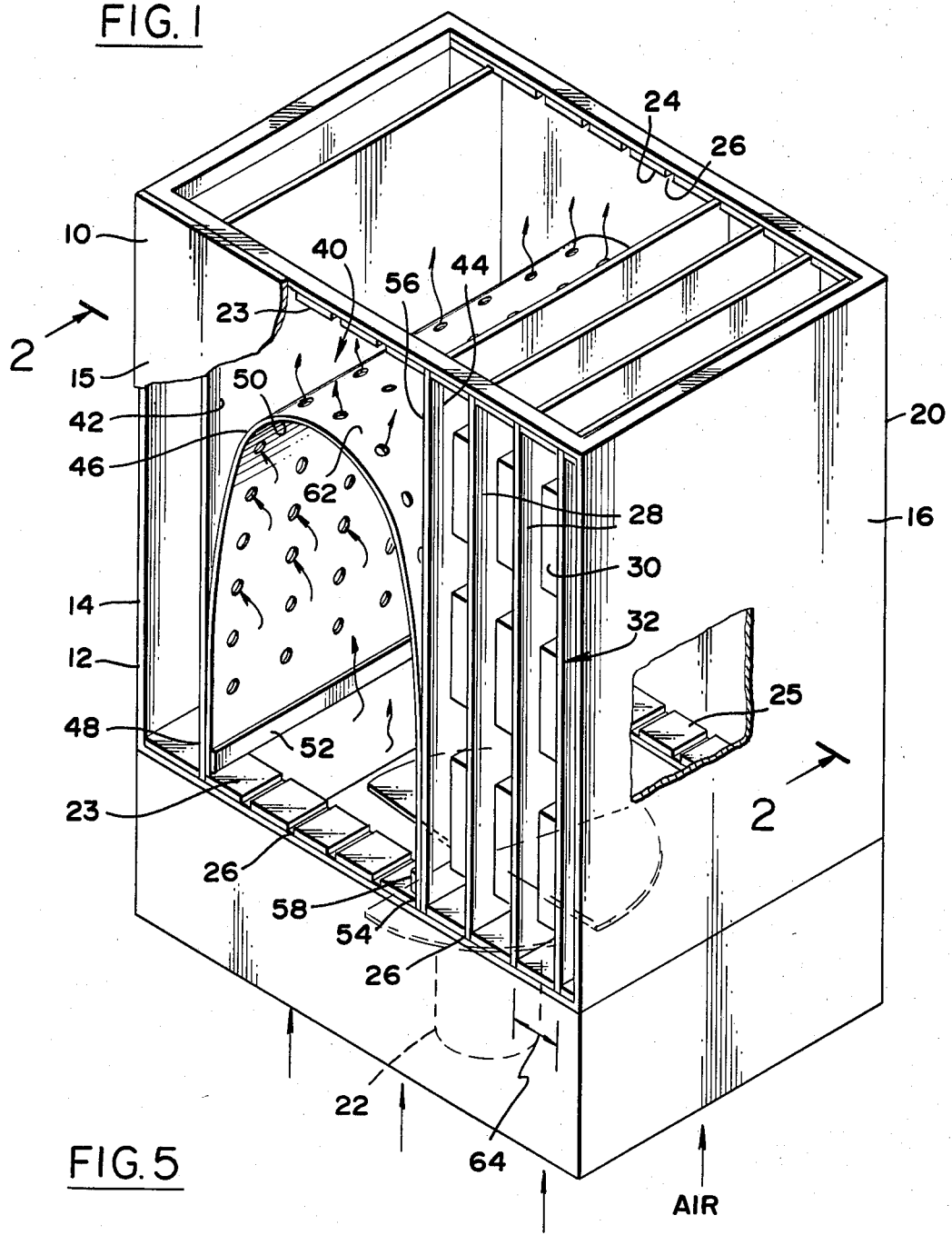
FIG. 5
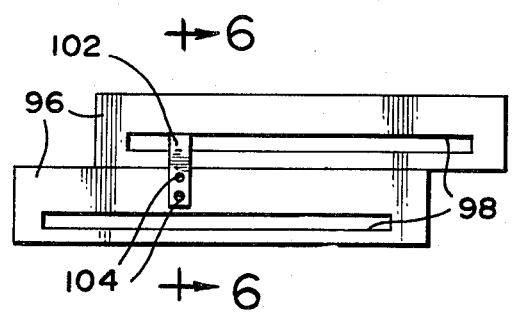
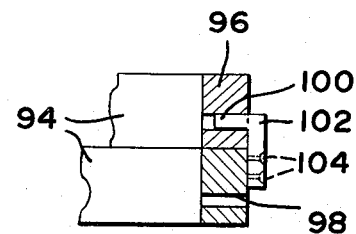
FIG. 6

FIG. 2
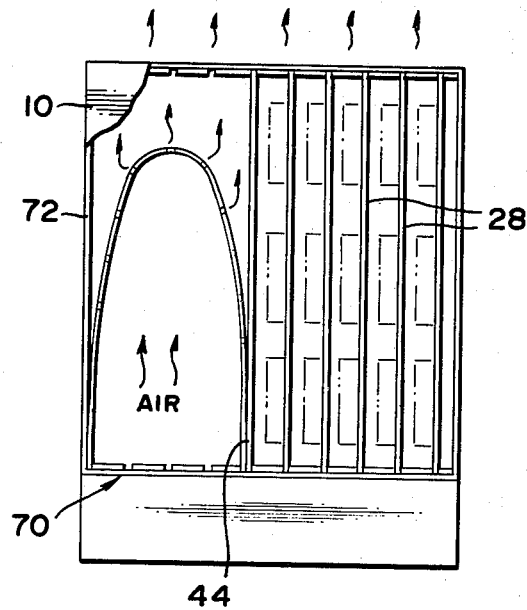
FIG. 3
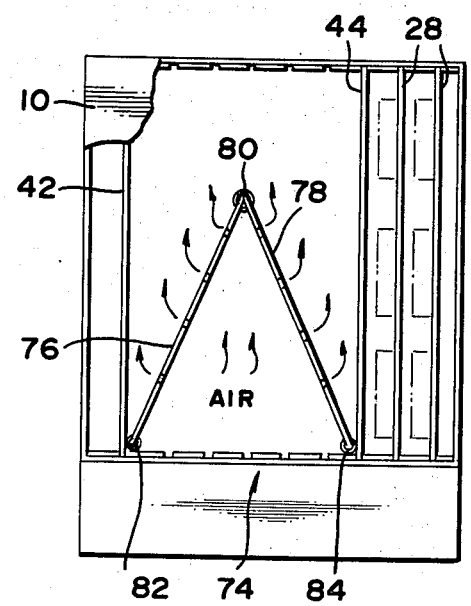
FIG. 4
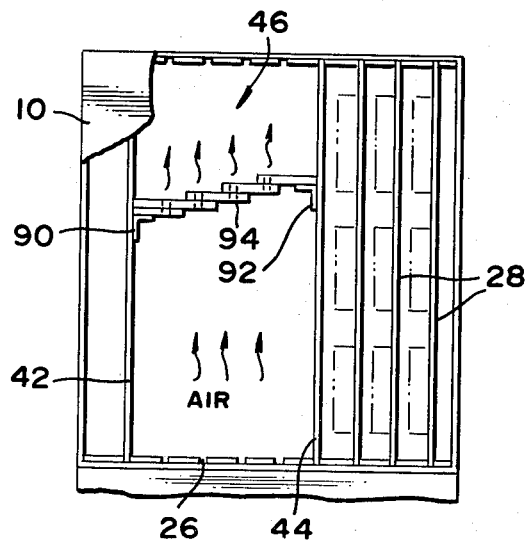
FIG. 7
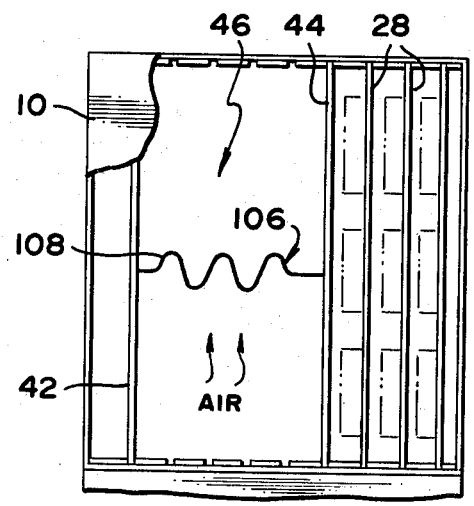
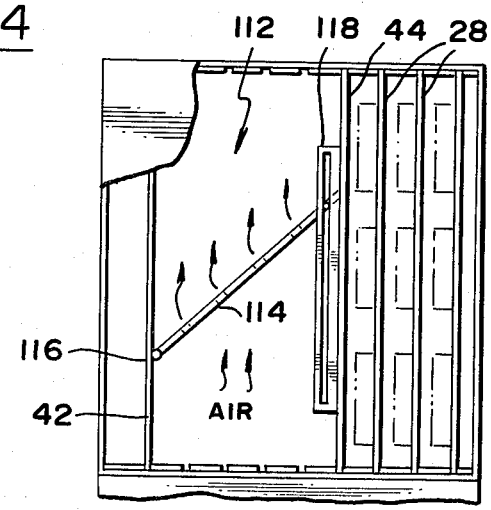
FIG. 8

AIR BAFFLE ASSEMBLY FOR ELECTRONIC CIRCUIT MOUNTING FRAME

This is a continuation of application Ser. No. 133,277 filed Mar. 24, 1980, now abandoned.

BACKGROUND OF THE INVENTION

1. Field of the Invention

This invention relates to variable width, constant impedance baffles for maintaining proper air flow distribution throughout a partially populated electronic circuit mounting frame.

2. Description of the Prior Art

It is a common practice to mount electronic circuitry on planar printed circuit boards to form printed circuit board assemblies. The printed circuit board assemblies are then assembled in a closely spaced parallel relationship within a frame or cabinet which is often referred to as a chassis. The frame is provided with a plurality of edge slot sets, each receiving and mounting a printed circuit board assembly. Typically printed circuit board assemblies are slideably inserted into the slot sets from a front side of the frame and have printed plug connectors for engaging and providing electrical connection to a receptacle connector at the opposite, back side of the frame. Usually the receptacle connectors are part of a backplane wiring assembly which provides a desired interconnection between printed circuit board assemblies.

It is often necessary to provide forced air cooling of electronic components of the printed circuit board assemblies and for this purpose a fan is disposed to blow air through the frame in a direction parallel to the planes of the printed circuit board assemblies. Frequently two or more mounting frames are stacked so that a single fan can blow air through a plurality of mounting frames.

Ordinarily the printed circuit board assemblies will be populated with similar components such as dual-in-line packages and are uniformly spaced so that they present approximately equal impedances to the flow of cooling air and cause the air to be uniformly distributed throughout the frame. However, a problem arises when a frame is less than fully populated with printed circuit board assemblies. For example, a memory frame might be sold in a minimum size configuration with empty slots available for expansion or a computer mounting frame might have slots available for the addition of more memory or additional input/output boards.

Whenever one or more vacant slots occur in a mounting frame the distribution of impedance becomes unequal and cooling air preferentially flows through the vacant slots. As a result, the cooling air flow to the mounted printed circuit board assemblies is reduced and their circuit components tend to operate at high temperatures. This results in decreased reliability or undesirable design tradeoffs such as selection of high temperature components, decreasing of component density on a circuit board or greater use of expensive heat sinks. Furthermore, when an uneven impedance distribution causes an uneven air flow in one frame, the air flow in adjacent frames will also be uneven, whether or not the adjacent frames are fully populated.

A number of schemes have been employed to evenly distribute the air flow in a partially populated frame. One scheme employs "unit" baffles or dummy printed circuit board assemblies approximating the air flow impedance of an operative printed circuit board assembly. This scheme can require the utilization of a large number of "unit" baffles. For example, 20 open slots in a frame would require the use of 20 "unit" baffles.

A special population distribution is also used on occasion. That is, the printed circuit board assemblies are distributed uniformly across the available slots in a chassis. However, as the number of boards changes the air flow and cooling changes. Furthermore, special design considerations may be required to permit an even distribution of circuit boards to be maintained as the number of printed circuit board assemblies in a frame is changed.

Rigid baffles providing an air blockage have also been used. They are suitable only for a given size of vacant space within a chassis. Different baffles must be assembled for each different number of vacant slots, thus increasing inventory as well as manufacturing problems. Because air flow is blocked in the vacant regions of a mounting frame, air flow distribution changes with the number of vacant slots in the frame and uneven air flow is provided to adjacent frames.

SUMMARY OF THE INVENTION

A variable width, constant impedance baffle assembly for distribution within an electronic mounting frame having facilities and space for receiving and mounting a given number of electronic elements and passing cooling air therethrough includes an apertured and variably positionable web configured to extend across a space within the electronic frame which varies in size with the number of electronic elements actually mounted in the electronic frame. The web member presents an impedance to the flow of cooling air through the space which is approximately uniform across the space and approximately equal to the impedance presented by a mounted circuit element irrespective of the size of the space. The web member may have a bend or curvature with an angle or radius of curvature that is selectable to permit the web member to extend across vacant spaces of varying sizes in accordance with the number of vacant slots for printed circuit board assemblies.

The web member has a plurality of small apertures distributed over the surface thereof and occupying a portion of the surface area selected to provide an air flow impedance which approximates the impedance of a printed circuit board assembly. This can be accomplished by making the ratio of aperture area to total web surface area approximately equal to the ratio of area in a plane normal to the flow of air occupied by a printed circuit board assembly or element to the total area available for the element. To maintain an even air flow impedance distribution across the vacant space it is preferred that the area of each aperture not exceed the square of the center-to-center spacing of printed circuit board assemblies mounted immediately adjacent to one another.

In specific arrangements the web member may be a flexible planar sheet of material such as Mylar arched across the vacant space, flat members having a central bend or hinge, a plurality of slots in parallel sliding relationship, a planar member hinged at one edge and slideably mounted at an opposite edge or a multiple bend, corrugated extendable member. The web member can extend between a pair of end boards which mount in the frame as though they were printed circuit boards of a printed circuit board assembly or between a side of the frame and an end board.

BRIEF DESCRIPTION OF THE DRAWINGS

A better understanding of the invention may be had from a consideration of the following detailed description taken in conjunction with the accompanying drawings in which:

FIG. 1 is a broken away perspective view taken from the front of an electronic circuit mounting frame assembly with a baffle assembly in accordance with the invention mounted therein;

FIG. 2 is an alternative embodiment of a baffle assembly in accordance with the invention;

FIG. 3 is an alternative embodiment of a baffle assembly in accordance with the invention;

FIG. 4 is another alternative embodiment of a baffle assembly in accordance with the invention;

FIG. 5 is a fragmentary front view of a portion of the baffle assembly shown in FIG. 4;

FIG. 6 is a fragmentary sectional side view of a portion of the baffle assembly shown in FIG. 5 taken along line 6—6 in the direction of the arrows;

FIG. 7 is another alternative embodiment of a baffle assembly in accordance with the invention; and FIG. 8 is still another alternative embodiment of a baffle assembly in accordance with the invention.

DETAILED DESCRIPTION

Referring now to FIG. 1, an electronic frame or chassis 10 is defined by suitable corner framing members 12 upon which are secured thin planar sheets defining a left side wall 14, a right side wall 16, a front wall 18 and a back wall 20. The bottom is left uncovered to permit cooling air from a fan 21 to pass therethrough and upwardly through an uncovered top where the cooling air may be vented to the atmosphere or alternatively passed through an additional electronic frame like the frame 10 (not shown). The mounting frame 10 includes at the front and rear, upper and lower mounting brackets 22, 23, 24, 25 with slots 26 therein for receiving printed circuit boards 28 having electronic components 30 thereon to form printed circuit board assemblies 32. The electronic components 30 have been shown in simplified form to more clearly illustrate the invention. Typically, the rear edge of the printed circuit board 28 will have printed edge connectors formed thereon for engagement with connectors which have not been explicitly shown. These connectors, in combination with backplane wiring provide electrical interconnection between printed circuit board assemblies 32. It will be further appreciated that the electronic frame 10 has been shown in a simplified form. In general, the frame 10 may be of any suitable design for receiving and mounting printed circuit board assemblies, preferably in an opposed parallel spaced relationship.

In the arrangement illustrated in FIG. 1, only three of nine available mounting positions are occupied by printed circuit board assemblies 32. The space within the frame 10 which remains available for additional printed circuit board assemblies is occupied by a baffle assembly 40 which includes first and second parallel spaced-apart, flat planar end members 42, 44 mounted as though they were printed circuit boards within the slots 26 for printed circuit board mounting positions at opposite sides of the space within the frame 10 which is not occupied by printed circuit board assemblies 32. A resiliently flexible sheet of material such as Mylar plastic forms a web member 46 arching across the unoccupied space between the first and second end members 42, 44.

A first edge 48 of web member 46 is secured to a surface 58 of the end member 42 which faces end member 44 near the bottom thereof by a mounting strip 52 and a suitable fastening mechanism such as rivets, staples, or adhesive. Similarly, a second edge 54 of web member 46 opposite first edge 48 is secured to a surface 56 of end member 44 which faces end member 42 near the bottom thereof by a mounting strip 58 and a suitable fastening mechanism.

The web member 46 has a plurality of apertures 60 formed therein. The apertures 60 have an area selected to occupy a proportion of a total area of surface 62 of web member 46 which will cause web member 46 to present an impedance to the flow of cooling air through the vacant space in frame 10 which is substantially the same as the impedance to the flow of cooling air which is presented by printed circuit board assemblies 32 when mounted within frame 10. In order to provide a substantially uniform flow of cooling air across the vacant space from front to back and from side to side irrespective of the size of the vacant space, it is desirable that the apertures 60 be substantially uniformly spaced across the surface 62 of web member 46. A generally round or square configuration for apertures 60, coupled with a maximum area for each aperture which does not exceed the square of the center-to-center spacing 64 of printed circuit board 28 assures that there will be a uniform air flow distribution throughout the vacant space. The aperture 60 area limitation coupled with the shape eccentricity limitation assure that there will be a sufficiently large number of apertures with a sufficiently even area distribution throughout the vacant space to achieve a uniform air flow distribution. If a few large apertures or eccentrically shaped apertures were used an undesirable variation in impedance with vacant area size or with position within the vacant area might result.

A close approximation of the desired air flow impedance can be achieved by making the ratio of the aperture 60 area to total area of surface 62 equal to the ratio of unoccupied space between printed circuit board assemblies 32 projected upon a plane perpendicular to the direction of air flow to the total area which results from the projection of the center-to-center spacing of two printed circuit boards upon said plane. For example, if the center-to-center spacing 64 of printed circuit boards 28 is 0.625 inch the total area per printed circuit board projected upon a plane perpendicular to the cooling air flow direction is 0.625×D, where D is the depth or front-to-back distance between the vertical edges of the printed circuit boards 28. If a printed circuit board has a thickness of 0.062 inch and the electronic components thereon extend to a thickness of 0.35 inch away from the surface of the printed circuit board, the printed circuit board 28 and electronic components 30 mounted thereon will project an area of (0.062+0.35)×D=0.412×D square inches onto a plane perpendicular to the air flow direction. This means that the unoccupied space projected onto a perpendicular plane within a region of frame 10 occupied by printed circuit board assemblies 32 is (0.625−0.411) D=0.213 D square inches. To match the impedance of a printed circuit board assembly 32, the web member 46 should have a proportion of aperture area to total surface area to approximately 0.213 D÷0.625 D=0.342.

For convenient calculation, the apertures 60 can be mounted on one inch centers in both the front-to-back and side-to-side directions of the surface 62 of the web member 46 so that there is one square inch of surface area per aperture and the required proportion will be attained if each aperture 60 has an area of 0.342 square inches. For apertures disposed on one inch centers the proper proportion of aperture area will be achieved if circular apertures are utilized with a diameter of two times the square roof of $(A \div \pi)$ or two times the square root of $0.342 \div \pi = 0.66$ inch, where A is the area of the aperture. In one embodiment the required ratio of aperture area to total surface area was satisfactorily approximated by 0.5 inch diameter holes on one inch centers. Because the proportion of aperture area to total surface area 62 of web member 46 remains the same irrespective of the angular relationship between any given point on the surface 62 and the cooling air flow direction, (ignoring the insignificant thickness of the web member 46), the impedance to the flow of cooling air presented by web member 46 remains substantially constant irrespective of the position within the vacant space or the distance by which the first and second end members 42, 44 must be separated to permit the baffle assembly 40 to occupy the vacant space.

Alternative arrangements of baffle assemblies in accordance with the invention are illustrated in simplified form in FIGS. 2-8. FIG. 2 illustrates an arrangement of a baffle assembly 70 in which the first end member 42 is eliminated and the web member 46 is arched between the second end member 44 and a wall 72 of the electrical mounting frame 10.

FIG. 3 illustrates another alternative arrangement in which a baffle assembly 74 includes two flat planar web member sections 76, 78 hingedly connected along adjacent edges by a hinge mechanism 80 with opposite edges connected to end members 42, 44 by hinge mechanisms 82, 84 respectively.

FIG. 4 illustrates an alternative arrangement in which a baffle assembly 88 includes mounting brackets 90, 92, mounting the web member 46 to the end members 42, 44 respectively. The web member 46 comprises a plurality of web member slat-like elements disposed in parallel sliding relationship.

Referring further to FIGS. 5 and 6, it can be seen that the parallel sliding relationship can be achieved by terminating each end of a web member element 94 in an end bracket 96 having a transversely extending slot 98 slideably receiving and guiding a lug 100 of a retaining member 102 which is suitably secured to the end bracket 96 of an adjacent web member element 94 as by screws 104. The web member elements 94 are thus permitted to slide relative to each other as necessary to accommodate the spacing between end mounts 42, 44 with the ratio of aperture area to total area of the web member elements 94 remaining substantially constant as the end members 42 and 44 are extended and retracted as necessary to occupy the vacant space within the frame 10.

In another arrangement illustrated in FIG. 7, a baffle assembly 106 includes a corrugated web member 46 extending between end members 42 and 44. A plurality of corrugations 108 provided by a succession of oppositely inverted small arches permit the web member 46 to be extended and retracted in accordance with the spacing between end members 42 and 44. Still another arrangement is shown in FIG. 8 wherein a baffle assembly 112 includes a stiff, planar web member 114 extending between end members 42 and 44. One edge of web member 114 is rotatably mounted by a hinge mechanism 116 to end member 42 near the bottom thereof and is slidably mounted by a slot and pin mechanism 118 to end member 44 to permit the spacing between end members 42 and 44 to be adjusted.

While there have been shown and described above particular arrangements of electronic mounting frame baffle assemblies in accordance with the invention for the purpose of teaching the manufacture and use of the invention by a person of ordinary skill in the art, it will be appreciated that the invention is not limited thereto. Accordingly, any modifications, variations, or equivalent arrangements within the scope of the attached claims should be considered to be within the scope of the invention.

What is claimed is:

1. An assembly comprising:
    an electronic mounting frame adapted to receive and maintain in parallel spaced relationship a maximum number of electronic elements;
    at least one and less than the maximum number of electronic elements, each occupying an amount of space; and
    a baffle assembly that is adaptable for insertion into the electronic mounting frame in place of a selectable given number of electronic elements, the baffle assembly being inserted into the electronic mounting frame in place of a selected given number of electronic elements and having a web member including at least one bend having an angle which may be varied to permit the web member to extend or retract as necessary to extend across a space that is occupiable by the selectable given number of electronic elements, the web member extending across a space within the electronic mounting frame that is occupiable by the selected given number of electronic elements, the web member having a plurality of apertures therethrough with a ratio of total aperture area to total web member surface area being approximately equal to a ratio of space occupied by one of the electronic elements to total space available for the one electronic element within the frame, the plurality of apertures presenting an impedance to a flow of cooling air through the electronic mounting frame which approximates an impedance which would be presented by the selected given number of electronic elements if said given number of electronic elements were inserted into the electronic mounting frame in the space occupied by the baffle assembly.

2. The assembly according to claim 1 above, wherein the area of each aperture in the web member does not exceed a square of a center-to-center spacing of two electronic elements mounted immediately adjacent to one another in the electronic mounting frame.

3. The assembly according to claim 2 above, including first and second end boards mounted in the electronic mounting frame at opposite sides of a vacant portion of a space as though the first and second end boards were circuit boards of a printed circuit board assembly and wherein the web member is an arched, relatively thin, flexible member secured to facing surfaces of the first and second end boards along first and second opposite edges respectively of the web member.

4. The assembly according to claim 2 above, wherein the electronic mounting frame has a space therein for receiving printed circuit board assemblies having printed circuit boards, and wherein the baffle assembly includes an end board mounted within the space as though the end board were a printed circuit board of a printed circuit board assembly and wherein the web member is a thin, flexible, arched member having a first edge secured to the electronic mounting frame and an opposite second edge secured to a surface of the end board facing the first edge.

5. The assembly according to claim 2 above, wherein the electronic mounting frame has a space therein for receiving printed circuit board assemblies having printed circuit boards, and wherein the baffle assembly includes first and second end boards mounted in the electronic mounting frame on opposite sides of a space for receiving the selected given number of electronic elements as though the first and second end boards were printed circuit boards of a printed circuit board assembly and wherein the web member comprises two flat members extending between facing surfaces of the first and second end boards with a central, variable angle bend therebetween to form an arch.

6. The assembly according to claim 2 above, including first and second end boards mounted in the electronic mounting frame on opposite sides of a space as though the first and second end boards were printed circuit boards of a printed circuit board assembly and wherein the web member is a flexible member extending between facing surfaces of the first and second end boards with a plurality of flexible corrugations to permit the web member to be deployed and retracted as the distance between the facing surfaces is increased and decreased respectively to accommodate the size of the space.

7. An assembly comprising:
an electronic mounting frame adapted to receive and maintain in parallel spaced relationship a maximum member of electronic elements;
at least one and less than the maximum number of electronic elements inserted into the electronic mounting frame, each occupying an amount of space within the electronic mounting frame; and
a baffle assembly inserted into the electronic mounting frame in place of a selected given number of electronic elements and including first and second end boards mounted in the electronic mounting frame on opposite sides of a space for receiving the selected given number of electronic elements as though the first and second end boards were printed circuit boards of a printed circuit board assembly and a web member having a plurality of slats extending between facing surfaces of the first and second end boards, the slats being disposed in parallel sliding relationship to immediately adjacent slats to permit the web member to be deployed and retracted as the distance between the facing surfaces is increased and decreased respectively to accommodate the size of the space, the web member having a plurality of apertures therein presenting an impedance to a flow of air through the space approximating an impedance presented by a maximum number of electronic elements within the space.

8. An assembly comprising:
an electronic mounting frame having a given number of oppositely disposed pairs of slots adapted to receive and maintain in parallel spaced relationship a given number of electronic elements;
at least one and less than the given number of electronic elements disposed within the mounting frame, each of the at least one electronic elements being received and maintained in place by a different pair of slots; and
a baffle assembly inserted into the electronic mounting frame in place of a selected given number of electronic elements and including first and second planar end boards, each being received and maintained in place on opposite sides of a space by a different pair of slots and a web member including a substantially planar member extending between facing surfaces of the first and second planar end boards, the web member being hingedly secured to the first end board and slideably secured to the second end board so as to slide in the plane of the second end board and thereby accommodate changes in the distance between the first and second end boards, the web member having a plurality of apertures therein presenting an impedance to a flow of air through the space approximating an impedance presented by a maximum number of electronic elements within the space.

9. An assembly comprising an electronic mounting frame having a plurality of slots for receiving and mounting a plurality of printed circuit board assemblies; a plurality of printed circuit board assemblies mounted within the electronic mounting frame in opposed parallel spaced relationship with a predetermined spacing between immediately adjacent printed circuit board assemblies; and an apertured web member mounted within a space within the electronic mounting frame and secured by at least one of said slots as a substitute for an impedance to a flow of cooling air presented by a selectable number of printed circuit board assemblies, the web member having a plurality of apertures, the area of each of which does not exceed the square of the predetermined spacing between immediately adjacent printed circuit board assemblies.

* * * * *